US010690726B2

(12) United States Patent
Koizumi et al.

(10) Patent No.: US 10,690,726 B2
(45) Date of Patent: Jun. 23, 2020

(54) POWER SUPPLY SYSTEM AND VEHICLE

(71) Applicant: Honda Motor Co., Ltd., Tokyo (JP)

(72) Inventors: Yuki Koizumi, Saitama (JP); Shigeru Namiki, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 16/154,741

(22) Filed: Oct. 9, 2018

(65) Prior Publication Data
US 2019/0120909 A1    Apr. 25, 2019

(30) Foreign Application Priority Data

Oct. 20, 2017  (JP) .................................. 2017-203954

(51) Int. Cl.
*G01R 31/392* (2019.01)
*H02J 7/00* (2006.01)
(Continued)

(52) U.S. Cl.
CPC .......... *G01R 31/392* (2019.01); *B60R 16/033* (2013.01); *G01R 31/379* (2019.01);
(Continued)

(58) Field of Classification Search
CPC ... G01R 31/392; G01R 31/379; H02J 7/0075; H02J 7/0069; H02J 7/007192; H02J 7/14;
(Continued)

(56) References Cited

U.S. PATENT DOCUMENTS 8,519,674 B2 *  8/2013  Anderson ............ G01R 31/392
                                                                 320/132
2010/0121587 A1   5/2010  Vian et al.
(Continued)

FOREIGN PATENT DOCUMENTS

JP    2000030753    1/2000
JP    2008039526    2/2008
(Continued)

OTHER PUBLICATIONS

"Office Action of Japan Counterpart Application", dated Jun. 4, 2019, with English translation thereof, p. 1-p. 10.

*Primary Examiner* — Stacy Whitmore
(74) *Attorney, Agent, or Firm* — JCIPRNET

(57) ABSTRACT

A power supply system includes a lead battery supplying power to the electric load of the vehicle, a battery sensor unit acquiring a value related to a state of the lead battery, and a battery deterioration determination device determining deterioration of the lead battery based on the value acquired by the battery sensor unit. The battery sensor unit acquires a value of a charge amount of the lead battery, a value of a discharge amount of the lead battery, and a value of a discharge depth of the lead battery. An ECU calculates a value of an effective charge/discharge amount of the lead battery based on a charge amount acquisition value, a discharge amount acquisition value and a discharge depth acquisition value acquired by the battery sensor unit and determines deterioration resulting from softening of a positive electrode active material based on the value of the effective charge/discharge amount.

16 Claims, 14 Drawing Sheets

(51) Int. Cl.
*G01R 31/379* (2019.01)
*H01M 10/48* (2006.01)
*B60R 16/033* (2006.01)
*H01M 10/44* (2006.01)
*H01M 10/42* (2006.01)
*H02J 7/14* (2006.01)

(52) U.S. Cl.
CPC ........... *H01M 10/48* (2013.01); *H02J 7/0069* (2020.01); *H02J 7/0078* (2013.01); *H02J 7/007192* (2020.01); *H02J 7/14* (2013.01); *H02J 7/1461* (2013.01)

(58) Field of Classification Search
CPC .... H02J 2310/46; H01M 10/60; H01M 10/48; H01M 10/44; H01M 10/42; H01M 2010/4271; H01M 10/06; H01M 10/486; H01M 2220/20; H01M 10/4221; H01M 10/4285; B60R 16/033
See application file for complete search history.

(56) References Cited

U.S. PATENT DOCUMENTS

| | | | | |
|---|---|---|---|---|
| 2014/0095092 | A1* | 4/2014 | Ikeda | H01M 10/48 702/63 |
| 2015/0280285 | A1* | 10/2015 | Fujita | H01M 10/26 429/9 |
| 2017/0005483 | A1* | 1/2017 | Miyake | H02J 3/32 |
| 2017/0141589 | A1* | 5/2017 | Inoue | H02J 7/1423 |
| 2017/0371000 | A1* | 12/2017 | Fukushima | G01R 31/382 |
| 2018/0257507 | A1* | 9/2018 | Kawai | B60L 58/12 |
| 2018/0321326 | A1* | 11/2018 | Tanaka | G01R 31/36 |
| 2019/0023148 | A1* | 1/2019 | Komiyama | B60L 58/16 |
| 2019/0033392 | A1* | 1/2019 | Mitsuyama | G01R 31/36 |

FOREIGN PATENT DOCUMENTS

| | | |
|---|---|---|
| JP | 2008255913 | 10/2008 |
| JP | 2009017752 | 1/2009 |
| JP | 2013233011 | 11/2013 |
| JP | 2015171296 | 9/2015 |
| JP | 2016109639 | 6/2016 |
| JP | 2016182022 | 10/2016 |
| WO | 2009118910 | 10/2009 |
| WO | 2014080764 | 5/2014 |

* cited by examiner

| temperature (°C) | corrosion amount increase rate (ppm) | temperature (°C) | corrosion amount increase rate (ppm) |
|---|---|---|---|
| 12.5> | a01 | 32.5 | a11 |
| 12.5 | a02 | 35 | a12 |
| 15.0 | a03 | 37.5 | a13 |
| 17.5 | a04 | 40 | a14 |
| 20 | a05 | 42.5 | a15 |
| 22.5 | a07 | 45 | a16 |
| 25 | a08 | 47.5 | a17 |
| 27.5 | a09 | 50 | a18 |
| 30 | a10 | <50 | a19 |

| increase rate of sulfation deterioration degree | | temperature (°C) | | | | | | |
|---|---|---|---|---|---|---|---|---|
| | | 0< | 10 | 20 | 30 | 40 | 50 | >50 |
| SOC[%] | >95 | b11 | b21 | b31 | b41 | b51 | b61 | b71 |
| | 90 | b12 | b22 | b32 | b42 | b52 | b62 | b72 |
| | 85 | b13 | b23 | b33 | b43 | b53 | b63 | b73 |
| | 60 | b14 | b24 | b34 | b44 | b54 | b64 | b74 |
| | 75 | b15 | b25 | b35 | b45 | b55 | b65 | b75 |
| | <70 | b16 | b26 | b36 | b46 | b56 | b66 | b76 |

POWER SUPPLY SYSTEM AND VEHICLE

CROSS-REFERENCE TO RELATED APPLICATION

This application claims the priority benefit of Japan Patent Application No. 2017-203954, filed on Oct. 20, 2017. The entirety of the above-mentioned patent application is hereby incorporated by reference herein and made a part of this specification.

BACKGROUND

Technical Field

The disclosure relates to a power supply system and a vehicle. More particularly, the disclosure relates to a power supply system including a lead battery for supplying power to an electric load of a vehicle and a vehicle mounted with the power supply system.

Description of Related Art

The vehicle is mounted with a lead battery to supply power to the vehicle accessories such as air conditioners, lights, and navigation systems. In addition, the vehicle is mounted with a power generator, and it is possible to drive the power generator by using the power of the engine, for example, to charge the lead battery as appropriate.

As the lead battery deteriorates according to its usage mode, in order to efficiently control charging/discharging of the lead battery, it is necessary to determine its deterioration degree appropriately. Patent Document 1 (Japanese Laid-open No. 2016-109639) shows a device for determining deterioration of a lead battery. Since the internal resistance of the lead battery tends to increase with progress of deterioration, in the device of Patent Document 1, the internal resistance value of the lead battery is calculated based on the current or voltage of the lead battery, and the deterioration is determined based on this internal resistance value.

However, with the internal resistance alone, it is not possible to precisely specify the deterioration degree of the lead battery. The lead battery deteriorates due to various factors and the specific contents of countermeasures to be taken to prolong the lifetime of the lead battery differ depending on the deterioration factor, and the deterioration factor cannot be identified based on the internal resistance alone. For this reason, it is required to determine the deterioration of the lead battery with a parameter different from the internal resistance.

SUMMARY

According to a first aspect of the disclosure, a power supply system (for example, the power supply system S described below) of the disclosure includes: a lead battery (for example, the battery 3 described below) supplying power to an electric load (for example, the first electric load 51 and the second electric load 52 described below) of a vehicle (for example, the vehicle V described below); a battery state acquisition device (for example, the battery sensor unit 6 described below) acquiring a value related to a state of the lead battery; and a battery deterioration determination device (for example, the ECU 7 described below) determining the deterioration of the lead battery based on the value acquired by the battery state acquisition device, wherein the battery state acquisition device acquires a value of a charge amount of the lead battery, a value of a discharge amount of the lead battery, and a value of a discharge depth of the lead battery, and the battery deterioration determination device determines deterioration of the lead battery based on a charge amount acquisition value, a discharge amount acquisition value, and a discharge depth acquisition value acquired by the battery state acquisition device.

BRIEF DESCRIPTION OF THE DRAWINGS

FIG. 9 is a diagram showing an example of a sulfation deterioration degree increase rate calculation table.

DESCRIPTION OF THE EMBODIMENTS

Figure 1:
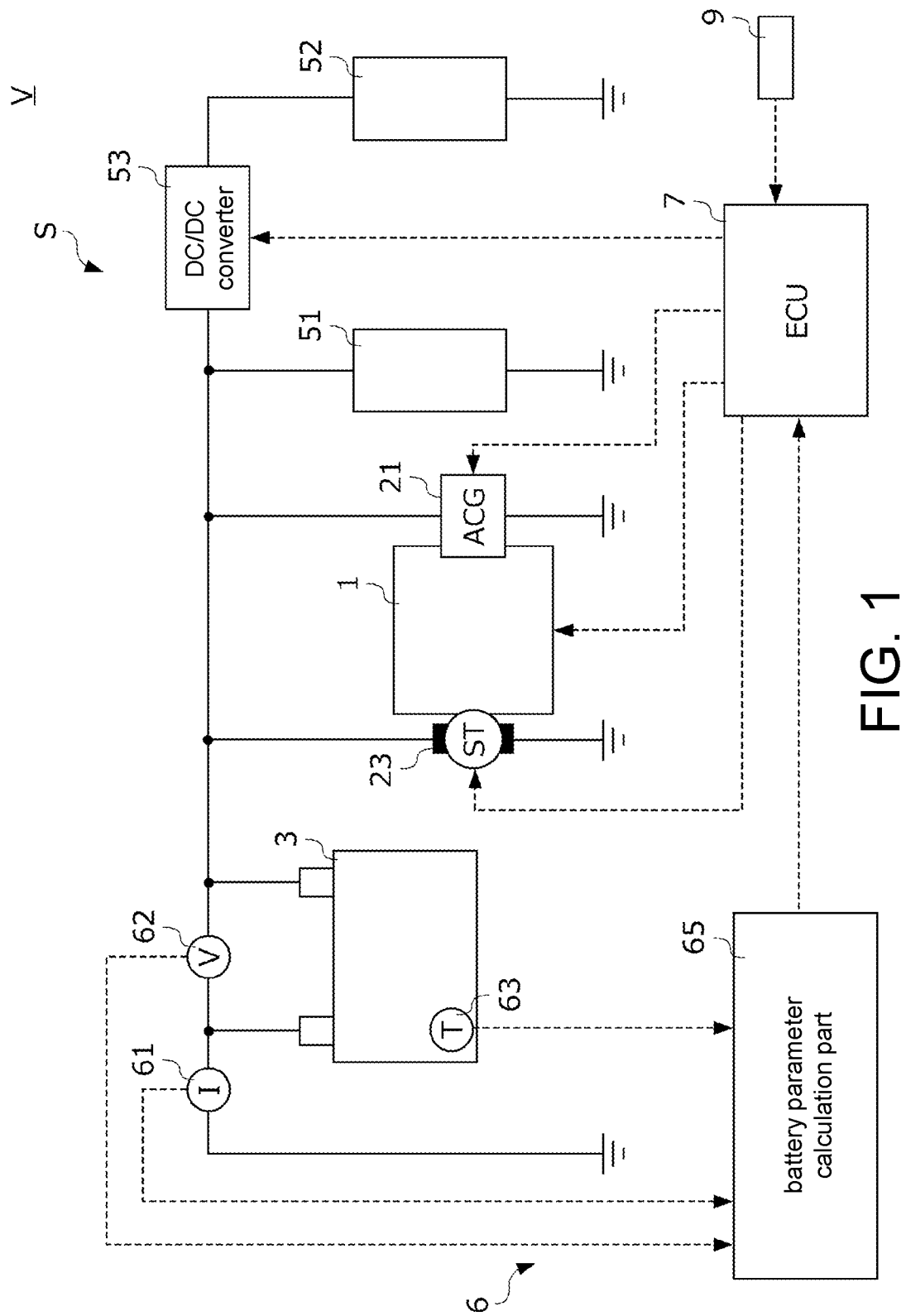
FIG. 1 is a diagram showing a configuration of a power supply system and a vehicle mounted with the power supply system according to an embodiment of the disclosure.

The disclosure provides a power supply system capable of accurately determining deterioration of a lead battery used to supply power to an electric load of a vehicle and a vehicle mounted with the power supply system.

According to a second aspect of the disclosure, the battery deterioration determination device may calculate an increment of a deterioration parameter (for example, the effective charge/discharge amount described below) indicating a degree of progress of deterioration of the lead battery by correcting a sum of the charge amount acquisition value and the discharge amount acquisition value over a predetermined period (for example, the driving cycle described below) based on a maximum discharge depth acquisition value, which is a maximum value of the discharge depth acquired in the predetermined period, and the battery deterioration determination device may calculate a value of the deterioration parameter by integrating the increment and determines deterioration of the lead battery based on the value of the deterioration parameter.

According to a third aspect of the disclosure, the battery deterioration determination device may increase the increment as the maximum discharge depth acquisition value increases.

According to a fourth aspect of the disclosure, the deterioration parameter may be a parameter indicating a degree of progress of deterioration resulting from softening of an active material of the lead battery.

According to a fifth aspect of the disclosure, a vehicle of the disclosure includes: the power supply system according to any one of the first aspect to the fourth aspect; an internal combustion engine (for example, the engine 1 described below); and an idling stop control device (for example, the ECU 7 described below) temporarily stopping the internal combustion engine in response to satisfaction of a stop condition and then restarting the internal combustion engine in response to satisfaction of a recovery condition, wherein the recovery condition includes that a discharge depth of the lead battery acquired during a period of temporarily stopping the internal combustion engine exceeds an allowable discharge depth, and when the battery deterioration determination device determines that the lead battery has deteriorated, the idling stop control device sets the allowable discharge depth to a value smaller than a value before the determination that the lead battery has deteriorated.

According to an sixth aspect of the disclosure, a vehicle of the disclosure includes: the power supply system according to any one of the first aspect to the fourth aspect; an internal combustion engine (for example, the engine 1 described below); a power generator (for example, the ACG 21 described below) connected in parallel to the lead battery with respect to the electric load and generating power by using power of the internal combustion engine; and a power generator control device (for example, the ECU 7 described below) controlling a power generation voltage of the power generator so that a charging rate of the lead battery is a target charging rate, wherein when the battery deterioration determination device determines that the lead battery has deteriorated, the power generator control device increases the target charging rate to be higher than a rate before the determination that the lead battery has deteriorated.

According to an sixth aspect of the disclosure, a vehicle of the disclosure includes: the power supply system according to any one of the first aspect to the fourth aspect; an internal combustion engine (for example, the engine 1 described below); a power generator (for example, the ACG 21 described below) connected to the lead battery; and a power generator control device (for example, the ECU 7 described below) controlling a power generation voltage of the power generator during fuel cut due to deceleration of the internal combustion engine, wherein when the battery deterioration determination device determines that the lead battery has deteriorated, the power generator control device reduces the power generation voltage to be lower than a value before the determination that the lead battery has deteriorated.

(1) One of the deterioration factors of the lead battery is progression of softening of the positive electrode active material. That is, as softening of the positive electrode active material progresses, the active material partly desorbs and shrinks, and the internal resistance increases. Softening of the active material starts at the time of charging/discharging for the first time after manufacture, and the progress rate of softening of the active material is correlated with the charge amount, the discharge amount, and the discharge depth of the lead battery. In the power supply system of the disclosure, the battery state acquisition device acquires the value of the charge amount, the value of the discharge amount, and the value of the discharge depth of the lead battery, and the battery deterioration determination device determines deterioration of the lead battery based on the charge amount acquisition value, the discharge amount acquisition value, and the discharge depth acquisition value. Therefore, according to the power supply system of the disclosure, it is possible to accurately determine the deterioration of the lead battery based on the factors specific to softening of the positive electrode active material.

(2) Softening of the positive electrode active material of the lead battery basically progresses as the charge amount and the discharge amount increase, but the rate of progress varies depending on the discharge depth. Therefore, in the power supply system of the disclosure, the battery deterioration determination device calculates the increment of the deterioration parameter by correcting the sum of the charge amount acquisition value and the discharge amount acquisition value over the predetermined period based on the maximum discharge depth acquisition value, which is the maximum value of the discharge depth acquired in the predetermined period, further calculates the value of the deterioration parameter by integrating the increment, and determines deterioration of the lead battery based on the value of the deterioration parameter. In the disclosure, the increment is calculated per unit time in consideration of the discharge depth, which greatly influences the progress of softening of the positive electrode active material, and by calculating the value of the deterioration parameter by integrating the increment, the deterioration of the lead battery can be determined more accurately.

(3) The softening rate of the positive electrode active material of the lead battery tends to be higher as the discharge depth increases. In the power supply system of the disclosure, taking this characteristic into account, the increment of the deterioration parameter in the predetermined period is increased as the maximum discharge depth acquisition value increases. As a result, the deterioration of the lead battery, in particular, the degree of deterioration resulting from softening of the positive electrode active material, can be adequately represented by the deterioration parameter.

(4) In the power supply system of the disclosure, the deterioration parameter is a parameter indicating the degree of progress of deterioration resulting from softening of the active material of the lead battery. As a result, the deterioration of the lead battery, in particular, the degree of deterioration resulting from softening of the positive electrode active material, can be adequately represented by the deterioration parameter.

(5) In the vehicle of the disclosure, when the battery deterioration determination device determines that the lead battery has deteriorated, the idling stop control device sets the allowable discharge depth to a value smaller than that before the deterioration determination. As described above, since the softening rate of the positive electrode active material of the lead battery tends to increase as the discharge depth increases, by decreasing the allowable discharge depth of the idling stop control, it is possible to delay the progress of deterioration resulting from softening of the positive electrode active material of the lead battery and prolong the lifetime of the lead battery.

(6) In the vehicle of the disclosure, when the battery deterioration determination device determines that the lead battery has deteriorated, the target charging rate of the lead battery of the power generator is increased to be higher than that before the deterioration determination. As described above, the softening rate of the positive electrode active material of the lead battery tends to increase as the discharge depth increases. On the other hand, when an operation of a specific electric load (e.g., the air conditioner or the like), which is a part of the electric loads mounted on the vehicle, is requested by a user, there are occasions where the power generation voltage of the power generator is forced to rise temporarily to supply the power necessary for this specific electric load. Since the power generator is connected in parallel to the lead battery with respect to the electric load, if the power generation voltage of the power generator rises as the specific electric load is operated as described above, the lead battery may be forcibly charged. Therefore, in the vehicle of the disclosure, when it is determined that the lead battery has deteriorated, by increasing the target charging rate of the lead battery and maintaining the charging rate high, even when the lead battery is forcibly charged due to operation of the specific electric load as described above, it is possible to prevent the discharge depth from increasing. Therefore, it is possible to delay the progress of deterioration resulting from softening of the positive electrode active material of the lead battery and prolong the lifetime of the lead battery.

(7) In the vehicle of the disclosure, when the battery deterioration determination device determines that the lead battery has deteriorated, the power generation voltage of the power generator during fuel cut due to deceleration of the internal combustion engine is reduced to be lower than that before the deterioration determination. As described above, since the softening rate of the positive electrode active material of the lead battery tends to increase as the discharge depth increases, by lowering the power generation voltage of the power generator during the fuel cut, it is possible to suppress the charge amount to the lead battery during the fuel cut, delay the progress of deterioration resulting from softening of the positive electrode active material of the lead battery, and thus prolong the lifetime of the lead battery.

Hereinafter, an embodiment of the disclosure will be described with reference to the drawings. FIG. 1 is a diagram showing a configuration of a power supply system S according to the present embodiment and a vehicle V mounted with the power supply system S. The vehicle V includes an internal combustion engine 1 (hereinafter referred to as "engine 1") as a power generation source for rotating a drive wheel (not shown).

The power supply system S includes a battery 3, an alternator 21 (hereinafter abbreviated as "ACG 21"), a starter 23, a DC/DC converter 53, a battery sensor unit 6, an ECU (electronic control unit) 7, and an ignition switch 9. The battery 3 is connected to loads, e.g., a first electric load 51 and a second electric load 52, mounted on the vehicle V and supplies power to the loads 51 and 52. The alternator 21 is connected in parallel to the battery 3 with respect to the loads 51 and 52 and uses the power of the engine 1 to generate power. The starter 23 starts the engine 1 by using the power supplied from the battery 3. The DC/DC converter 53 steps up or steps down the DC power of the battery 3 or the ACG 21 and supplies the DC power to the second electric load 52. The battery sensor unit 6 acquires values of various parameters for specifying the state of the battery 3. The ECU 7 is an electronic control module for controlling the engine 1, the ACG 21, the starter 23, the battery 3, and the like. The ignition switch 9 is operated when a driver starts or stops the vehicle V.

The electric loads 51 and 52 are constituted by various electronic devices, e.g., lights, air conditioners, navigation systems, electric power steering, sound equipment, or the like, mounted on the vehicle V.

The ACG 21 is connected to the crankshaft of the engine 1 via a belt (not shown) and is a power generator that generates power when being driven to rotate by the crankshaft. The power generated by the ACG 21 is supplied to the first electric load 51, the second electric load 52, and the DC/DC converter 53, and is consumed by these electric loads and consumed to charge the battery 3.

The ACG 21 is constituted by a regulator, a rotor coil, or the like. The ECU 7, which serves as a power generator control device for controlling the ACG 21, adjusts the current flowing through the rotor coil by controlling turning on/off of the switch of the regulator, and furthermore, controls the power generation voltage of the ACG 21. The ECU 7 controls the power generation voltage of the ACG 21 during running of the vehicle V, such that a charging rate (which expresses a ratio of the remaining capacity of the battery 3 to the full charge capacity as a percentage; hereinafter also referred to as "SOC (State of Charge)") of the battery 3 estimated by the battery sensor unit 6 described below is maintained at a target SOC set in the ECU 7.

More specifically, for example, when the SOC of the battery 3 is lower than the target SOC and charging of the battery 3 is requested, the ECU 7 controls the power generation voltage of the ACG 21 to be higher than the output voltage of the battery 3 to supply the required power to the electric loads 51 and 52 while charging the battery 3. Further, for example, when the SOC of the battery 3 is higher than the target SOC and discharging of the battery 3 is requested, the ECU 7 controls the power generation voltage of the ACG 21 to be lower than the output voltage of the battery 3 to prompt discharging from the battery 3 to the electric loads 51 and 52. As described above, the ECU 7 controls the charge amount and the discharge amount of the battery 3 by controlling the power generation voltage of the ACG 21 and maintains the SOC of the battery 3 substantially at the target SOC.

In addition, when an operation request of a specific electric load (specifically, for example, an air conditioner) having a particularly large power consumption among the electric loads included in the electric loads 51 and 52 is made, in order to respond to this operation request, the ECU 7 increases the output voltage of the ACG 21 to a predetermined setting voltage higher than the output voltage of the battery 3 and supplies the required power from the ACG 21 to the specific electric load. Therefore, the battery 3 may be forcibly charged when the specific electric load is operated.

The battery 3 is a secondary battery capable of both discharging for converting chemical energy into electric energy and charging for converting electric energy into chemical energy. The battery 3 is a so-called lead storage battery that uses lead dioxide as the positive electrode, spongy lead as the negative electrode, and dilute sulfuric acid as the electrolyte. More specifically, for example, an electrode lattice made of lead or a lead alloy is coated with lead dioxide as an active material to serve as the positive electrode. For example, an electrode lattice made of lead or a lead alloy is coated with lead as an active material to serve as the negative electrode.

The battery sensor unit 6 includes a plurality of sensors 61, 62, and 63 that directly detect the state of the battery 3, and a battery parameter calculation part 65 that calculates values of a plurality of battery parameters for specifying the state of the battery 3 by processing the output signals of the sensors 61 to 63.

The battery current sensor 61 transmits a detection signal corresponding to the current flowing through the battery 3 to the battery parameter calculation part 65. The battery voltage sensor 62 transmits a detection signal corresponding to the voltage between the terminals between the positive and negative electrodes of the battery 3 to the battery parameter calculation part 65. The battery temperature sensor 63 transmits a detection signal corresponding to the temperature of the battery 3 to the battery parameter calculation part 65.

The battery parameter calculation part 65 calculates values of the SOC (%), the charge amount (Ah), the discharge amount (Ah), the discharge depth (%), the SOH (%) (which indicates the deterioration degree of the battery 3), the average temperature (° C.), the maximum temperature (° C.), and the minimum temperature (° C.) of the battery 3 according to the following procedure by using the detection signals from the sensors 61 to 63, and transmits these values to the ECU 7.

The value of the charge amount of the battery 3 is calculated by integrating the charging current flowing into the battery 3 detected by the battery current sensor 61 in the battery parameter calculation part 65 over a predetermined period (e.g., a driving cycle from turning on to turning off of the ignition switch 9). The value of the discharge amount of the battery 3 is calculated by integrating the discharging current flowing out of the battery 3 detected by the battery current sensor 61 in the battery parameter calculation part 65 over a predetermined period (e.g., the above driving cycle or a soak period from turning off to turning on of the ignition switch 9).

In the battery parameter calculation part 65, during the running of vehicle V (that is, the period other than the above soak period), the detection signal from the battery temperature sensor 63 is acquired in predetermined cycles, and an average process is performed on the detection signal to calculate the average temperature value of the battery 3 for each predetermined cycle (for example, one hour). In the battery parameter calculation part 65, during the soak period of the vehicle V, the maximum temperature and minimum temperature values in the soak period are calculated by acquiring the detection signals from the battery temperature sensor 63 in predetermined cycles.

The value of the SOC of the battery 3 at the time when the current is not flowing is calculated by looking up a predetermined SOC-OCV map based on the open circuit voltage (OCV) of the battery 3 detected by the battery voltage sensor 62 in the battery parameter calculation part 65. Further, the value of the SOC of the battery 3 at the time when the current is flowing is calculated by a known algorithm (e.g., an algorithm using the Kalman filter or the like) with use of the detection signals from the sensors 61 to 63 in the battery parameter calculation part 65 while taking into consideration the voltage drop caused by the internal resistance of the battery 3.

The discharge depth of the battery 3 refers to the ratio of the discharge amount to the discharge capacity of the battery 3, and the value thereof is appropriately calculated in the battery parameter calculation part 65 by using the integrated value of the charging current and the discharging current detected by the battery current sensor 61.

For example, the value of the capacity retention rate of the battery 3 (the ratio of the current capacity to the initial capacity of the battery 3) estimated based on the known algorithm or the value of the resistance increase rate of the battery 3 (the ratio of the current internal resistance to the initial internal resistance of the battery 3) is used as the SOH value of the battery 3.

The starter 23 is a starter motor that starts the engine 1 by the power supplied from the battery 3. When the driver turns on the ignition switch 9 to start the vehicle V or when the driver restarts the engine 1 after executing idling stop control (which will be described below), the ECU 7 supplies power from the battery 3 to the starter 23 and starts the engine 1.

The ECU 7, which serves as an idling stop control device, executes idling stop control for temporarily stopping the engine 1 when all the following automatic stop conditions (a) to (e) are satisfied after the ignition switch 9 is turned on.

(a) The ignition switch 9 is on.

(b) The vehicle speed is equal to or lower than the start speed set slightly higher than 0.

(c) The opening angle of the accelerator pedal is substantially 0 degree.

(d) The brake pedal is being stepped on.

(e) The SOC of the battery 3 obtained by the battery sensor unit 6 is equal to or larger than a predetermined start threshold value.

After executing the idling stop control, the ECU 7 drives the starter 23 by using the power of the battery 3 and restarts the engine 1 when any one of the following automatic recovery conditions (f) to (h) is satisfied.

(f) Depression of the brake pedal has been removed.

(g) The SOC of the battery 3 obtained by the battery sensor unit 6 is equal to or less than an end threshold value set to a value smaller than the start threshold value.

(h) The discharge depth of the battery 3 obtained by the battery sensor unit 6 during the idling stop period exceeds a predetermined allowable discharge depth.

The ECU 7 includes an I/O interface for A/D converting the detection signals of the sensors, a RAM or ROM for storing various control programs and data, a CPU for executing various arithmetic processes according to the above programs, a drive circuit for driving the engine 1, the ACG 21, the starter 23, the battery 3, the DC/DC converter 53, and the like according to the arithmetic processing result of the CPU, and the like.

Hereinafter, a specific procedure for deterioration determination control of the battery 3 performed by the ECU 7 will be described.

Figure 2:
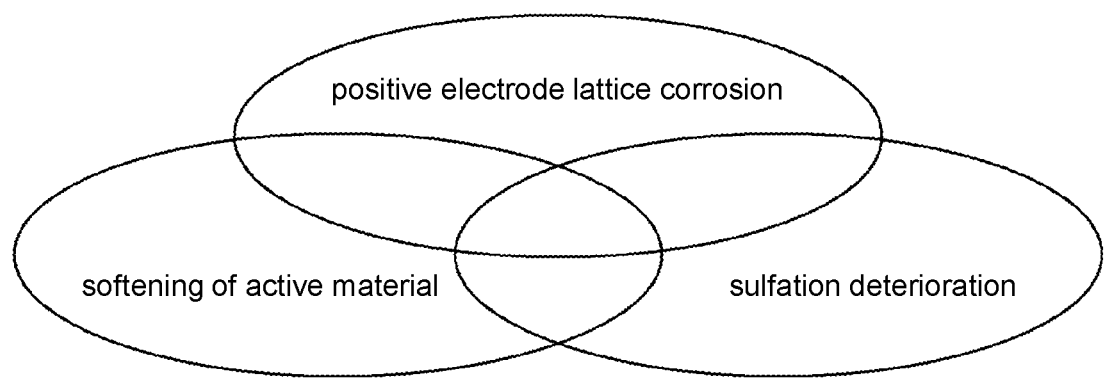
FIG. 2 is a diagram schematically showing factors for deterioration of a battery.

As the battery 3, which is a lead storage battery, starts to deteriorate from the time of manufacture (more specifically, from the time of manufacture or the time when charging/discharging starts after being mounted on the vehicle), the electric quantity of charge/discharge that the battery 3 is capable of gradually decreases from the time of manufacture. FIG. 2 is a diagram schematically showing factors for deterioration of the battery 3. As shown in FIG. 2, the deterioration factors of the battery 3 are mainly divided into positive electrode lattice corrosion, sulfation deterioration, and softening of active material.

Positive electrode lattice corrosion means that corrosion of the positive electrode lattice of the battery 3 progresses. As the corrosion of the positive electrode lattice progresses, the conductive path in the battery 3 breaks, the internal resistance increases, and the charge/discharge amount decreases.

Sulfation deterioration means that lead sulfate adheres to the surface of the electrode of the battery 3 and further hardens. In the battery 3, lead sulfate is generated on the surface of the electrode at the time of discharge, but basically this lead sulfate dissolves into the electrolyte during charging. However, when charging/discharging is repeated for a long time, the lead sulfate generated on the electrode crystallizes and hardens. Therefore, when sulfation deterioration excessively progresses, the internal resistance of the battery 3 increases and the effective surface area of the electrode decreases, and the charge/discharge amount decreases.

Softening of active material means that the active material applied to the positive electrode lattice softens. As the softening of the positive electrode active material progresses, the active material partly desorbs and shrinks, the internal resistance of the battery 3 increases, and the charge/discharge amount decreases.

As described above, deterioration of the battery 3 mainly progresses due to three factors, but the factors for progress of these three deteriorations are different from each other. Further, to prolong the lifetime of the battery 3 to a predetermined target lifetime (for example, several years), it is necessary to delay the progress of these three deteriorations, but the specific content of the optimum action of deterioration suppression for delaying each deterioration differs depending on the factors of deterioration. Therefore, the ECU 7 determines the degree of progress of positive electrode lattice corrosion, sulfation deterioration, and softening of active material according to different algorithms using the values of the battery parameters acquired by using the battery sensor unit 6. The description below explains specific procedures for determining the degree of progress of deterioration and specific procedures for action of deterioration suppression executed to delay the progress of deterioration in the order of positive electrode lattice corrosion, sulfation deterioration, and softening of active material.

<Deterioration Determination of Positive Electrode Lattice Corrosion>

Figure 3:
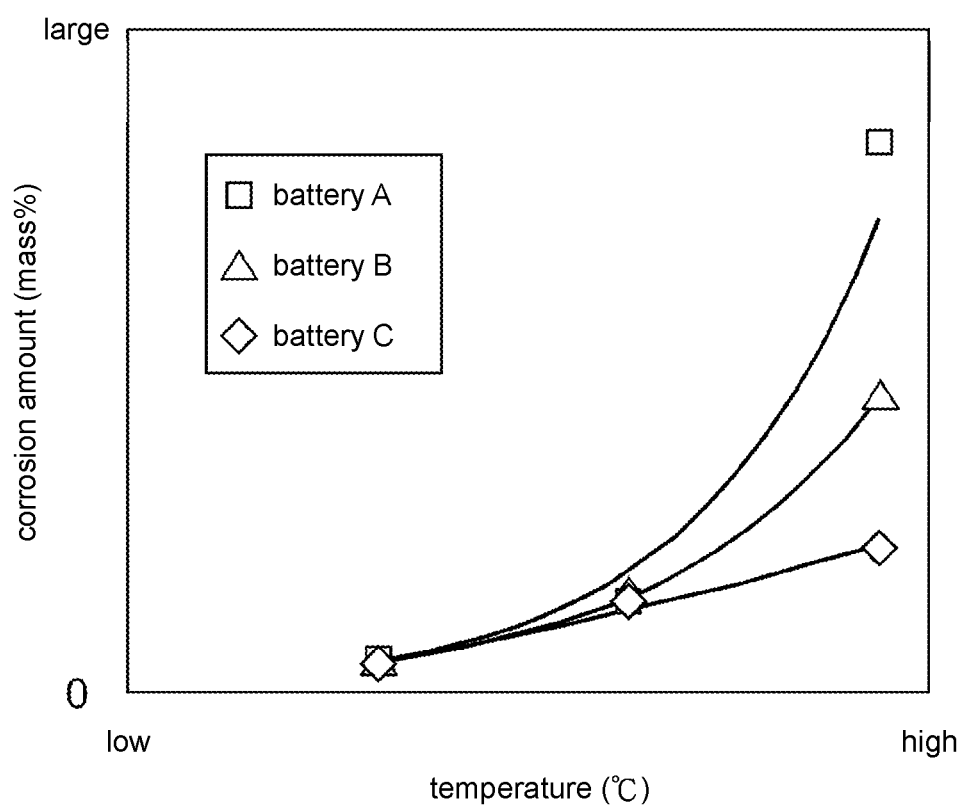
FIG. 3 is a diagram showing a result of a test performed to specify a factor that causes deterioration of positive electrode lattice corrosion.

First, the factors that cause deterioration of positive electrode lattice corrosion will be examined. FIG. 3 is a diagram showing a result of a test performed to specify a factor that causes deterioration of positive electrode lattice corrosion. In this test, batteries A, B, and C, which were lead storage batteries with different specifications, were prepared. After charging/discharging was repeatedly executed on the batteries A, B, and C under different temperature environments for a predetermined test time, the batteries were disassembled and the mass of the corrosion portion of the positive electrode lattice was measured. The horizontal axis in FIG. 3 is the temperature (° C.) in this test and the vertical axis is the corrosion amount (mass %). Here, the corrosion amount is the ratio of the mass of corrosion portion to the mass of the positive electrode lattice in its brand new condition. That is, the corrosion amount is 0 (mass %) in the brand new condition and then gradually increases as deterioration progresses.

As shown in FIG. 3, although there is a difference depending on the type of the battery, it is clear that the corrosion amount increases faster as the temperature of the battery increases in all types of the batteries. That is, it can be said that the degree of progress of deterioration of positive electrode lattice corrosion can be quantitatively evaluated by the corrosion amount defined as above, and this corrosion amount has a high correlation with the temperature of the battery 3. Therefore, the ECU 7 estimates the corrosion amount value of the battery 3 by using the data related to the temperature of the battery 3 acquired by the battery sensor unit 6 and further determines deterioration resulting from positive electrode lattice corrosion of the battery 3 based on this estimate of the corrosion amount.

Figure 4:
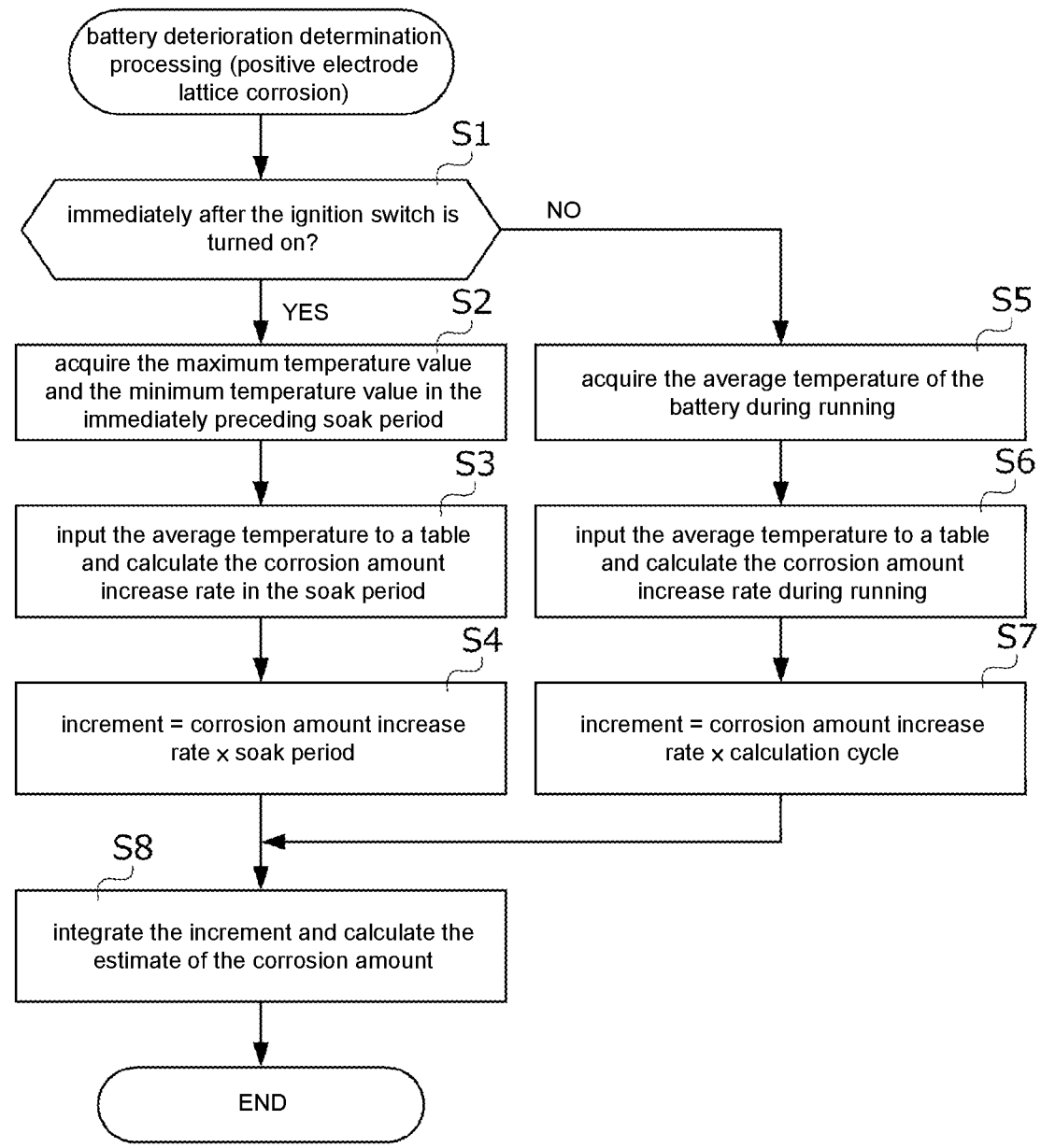
FIG. 4 is a flowchart showing a specific procedure for determining deterioration of a battery resulting from positive electrode lattice corrosion.

FIG. 4 is a flowchart showing a specific procedure for determining deterioration of the battery 3 resulting from positive electrode lattice corrosion. More specifically, FIG. 4 is a flowchart showing a specific procedure for calculating the estimate of the corrosion amount indicating the degree of progress of positive electrode lattice corrosion by the ECU 7. The flowchart of FIG. 4 is executed in the ECU 7 in each predetermined calculation cycle (for example, one hour) until the ignition switch 9 is turned off after the ignition switch 9 is turned on.

In S1, the ECU 7 determines whether it is immediately after the start of the engine 1, that is, whether it is immediately after the ignition switch 9 is turned on. The ECU 7 proceeds to S2 if the determination result of S1 is YES, and proceeds to S5 if the determination result of S1 is NO.

In S2 to S4, the ECU 7 estimates the increment of the corrosion amount in the immediately preceding soak period from when the ignition switch 9 is turned off the previous time until the ignition switch 9 is turned on this time. More specifically, the ECU 7 acquires from the battery sensor unit 6 the maximum temperature value and the minimum temperature value of the battery 3 in the immediately preceding soak period. In S3, the ECU 7 calculates the average temperature of the battery 3 in the immediately preceding soak period by using the maximum temperature value and the minimum temperature value (for example, average temperature=(maximum temperature value+minimum temperature value)/2). Further, by inputting the calculated average temperature to an association means that associates the temperature (° C.) of the battery 3 with the corrosion amount increase rate (ppm) corresponding to the increment of the corrosion amount per unit time, the ECU 7 calculates the value of corrosion amount increase rate.

Here, specifically, a table, a map, an arithmetic expression, a neural network, or the like defining the correlation between the temperature of the battery 3 and the corrosion amount increase rate when the battery 3 is used at this temperature is used as the association means.

Figures 5, 6:
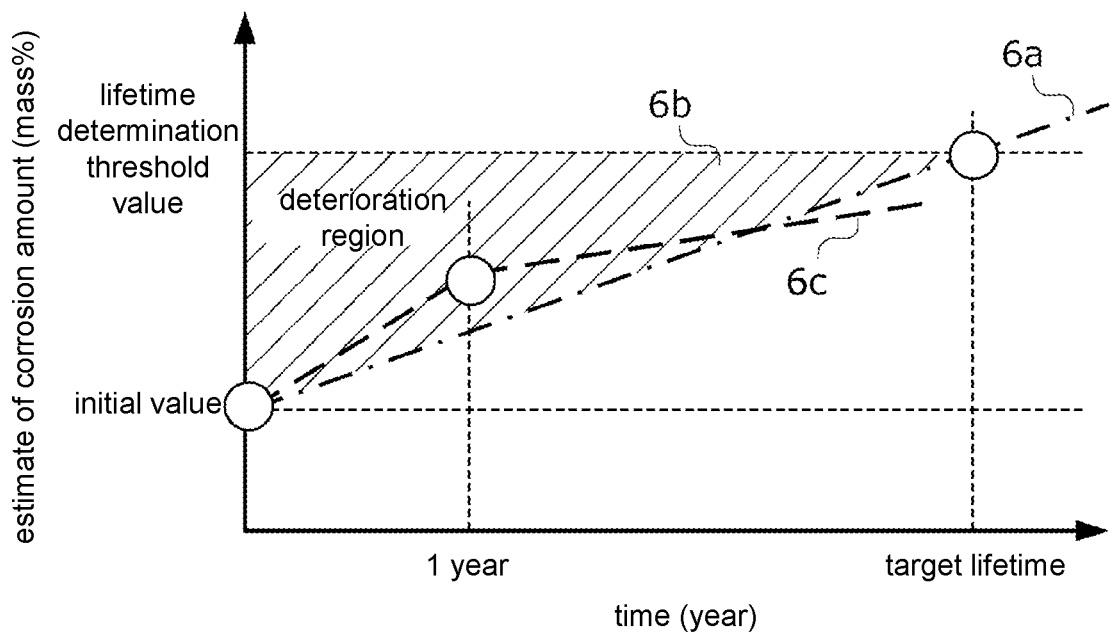
FIG. 5 is a diagram showing an example of a corrosion amount increase rate calculation table.
FIG. 6 is a diagram for explaining a specific procedure for action of deterioration suppression for suppressing deterioration resulting from positive electrode lattice corrosion.

FIG. 5 is a diagram showing an example of a corrosion amount increase rate calculation table. As shown in FIG. 5, the corrosion amount increase rate calculation table specifies the correlation between the temperature of the battery 3 and the corrosion amount increase rate per unit time when the battery 3 is used at this temperature. Such a corrosion amount increase rate calculation table is created by performing a test in advance on a battery of the same kind as the battery 3 used in the power supply system S and is stored in the storage medium of the ECU 7. As described with reference to FIG. 3, positive electrode lattice corrosion progresses faster as the temperature of the battery 3 increases. Therefore, the corrosion amount increase rate is set to a larger value as the temperature of the battery 3 increases. That is, in the example shown in FIG. 5, $a01<a02<a03<\ldots<a18<a19$.

Returning to FIG. 4, in S4, the ECU 7 calculates the increment (mass %) of the corrosion amount in the immediately preceding soak period by multiplying the corrosion amount increase rate, which is calculated by using the corrosion amount increase rate calculation table or the like in S3, by the immediately preceding soak period, and proceeds to S8.

In S5, the ECU 7 acquires the average temperature of the battery 3 during running from the battery sensor unit 6 in the period from the previous calculation cycle to the current calculation cycle.

In S6, the ECU 7 calculates the corrosion amount increase rate during running by inputting the average temperature acquired in S5 to the association means such as the corrosion amount increase rate calculation table shown in FIG. 5, for example.

In S7, the ECU 7 calculates the increment of the corrosion amount in this calculation cycle by multiplying the corrosion amount increase rate, which is calculated by using the corrosion amount increase rate calculation table or the like in S6, by the calculation cycle.

In S8, the ECU 7 calculates the estimate of the corrosion amount by integrating the increment calculated in S4 or S7. The ECU 7 calculates the estimate of the corrosion amount, which quantitatively represents the degree of progress of positive electrode lattice corrosion of the battery 3, by the above procedure and determines the deterioration of the battery 3 by using this estimate of the corrosion amount. More specifically, the ECU 7 determines the deterioration of the battery 3 by comparing the calculated estimate of the corrosion amount with a predetermined threshold value.

<Action of Deterioration Suppression of Positive Electrode Lattice Corrosion>

Next, a specific procedure for action of deterioration suppression for suppressing deterioration of the battery 3 resulting from positive electrode lattice corrosion as described above will be described.

FIG. 6 is a diagram for explaining a specific procedure for action of deterioration suppression. In FIG. 6, the horizontal axis is the time (year) elapsed from the time of manufacture of the battery 3 (more specifically, from the time of manufacture or from the time charging/discharging starts after being mounted on the vehicle) and the vertical axis is the estimate of the corrosion amount (mass %).

As mentioned above, the corrosion amount of the battery 3 cannot be stopped from increasing because deterioration progresses from the time of manufacture. However, it is possible to moderate the increase rate of the corrosion amount by appropriately executing the action of deterioration suppression described below. As described above, positive electrode lattice corrosion progresses faster as the temperature of the battery 3 increases. Therefore, when the estimate of the corrosion amount calculated as described above exceeds the predetermined threshold value, the ECU 7 determines that positive electrode lattice corrosion of the battery 3 has progressed to some extent and controls the power generation voltage of the ACG 21 so that the charging current flowing from the ACG 21 to the battery 3 and/or the discharging current flowing from the battery 3 to the electric loads 51 and 52 is smaller than that before the deterioration determination (action of deterioration suppression against positive electrode lattice corrosion). As described above, after the deterioration determination, by controlling the power generation voltage to make the charging current or discharging current smaller than that before the deterioration determination, it is possible to suppress heat generation resulting from charging/discharging of the battery 3 after the deterioration determination. Therefore, it is possible to delay the increase of the estimate of the corrosion amount of the battery 3 thereafter and prolong the lifetime of the battery 3.

Here, a timing for executing the action of deterioration suppression for suppressing deterioration resulting from such positive electrode lattice corrosion will be described. First, it can be said that, in order to prolong the lifetime of the battery 3 to the target lifetime, it is ideal that the estimate of the corrosion amount increases from a predetermined initial value and reaches a predetermined lifetime determination threshold value representing the lifetime of the battery 3 when the target lifetime has elapsed. In other words, it can be said that it is ideal that the estimate of the corrosion amount changes as shown by a dot-dash line 6a in FIG. 6. Therefore, when the estimate of the corrosion amount becomes larger than a threshold value, which increases according to the time elapsed from the time of manufacture of the battery 3 as shown by the dot-dash line 6a, that is, when the estimate of the corrosion amount belongs to a deterioration region 6b as represented by hatching in FIG. 6, the action of deterioration suppression against positive electrode lattice corrosion is executed to delay the increase of the estimate of the corrosion amount so that the estimate of the corrosion amount does not exceed the lifetime determination threshold value before reaching the target lifetime.

However, the progress rate of the positive electrode lattice corrosion changes according to the temperature of the battery 3, so it is considered that it varies with the season. That is, the increase rate of the estimate of the corrosion amount is not constant throughout the year as shown by the dot-dash line 6a. Therefore, the ECU 7 determines whether the estimate of the corrosion amount belongs to the deterioration region 6b each year, for example, taking into consideration the temperature change of each season. Also, as shown by a thick broken line 6c, if the estimate of the corrosion amount belongs to the deterioration region 6b each year, the action of deterioration suppression is executed over a predetermined period to delay the increase of the estimate of the corrosion amount so that the estimate of the corrosion amount does not exceed the lifetime determination threshold value before reaching the target lifetime.

<Deterioration Determination of Sulfation Deterioration>

Next, a specific procedure for determining the degree of progress of deterioration of the battery 3 resulting from sulfation deterioration will be described. First, the factors that cause sulfation deterioration will be examined.

Figure 7A:
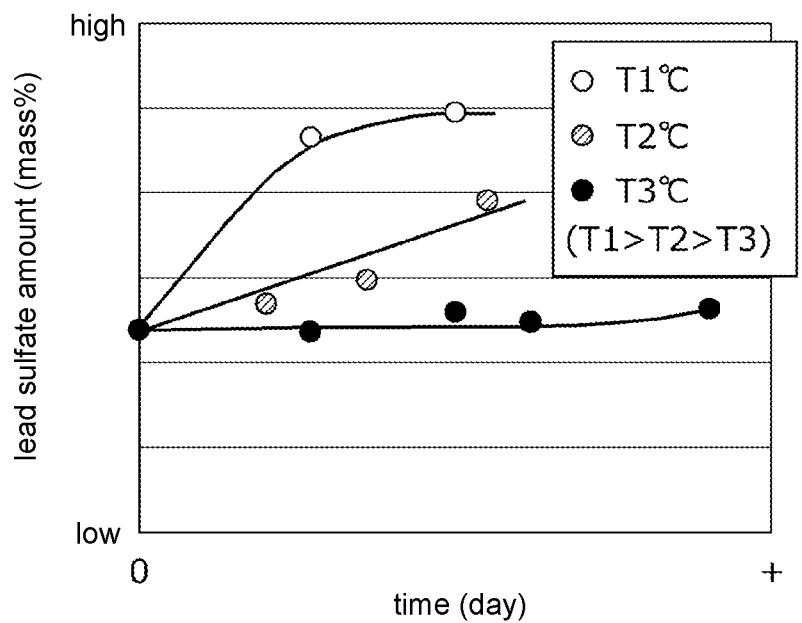
FIG. 7A is a diagram showing a result of a test performed to specify a factor that causes sulfation deterioration.
Figure 7B:
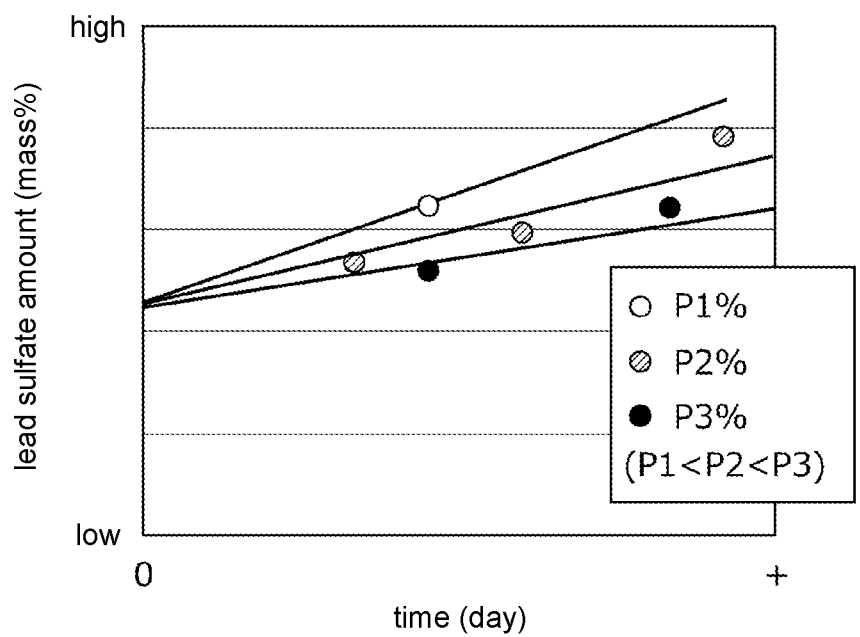
FIG. 7B is a diagram showing a result of a test performed to specify a factor that causes sulfation deterioration.

FIG. 7A and FIG. 7B are diagrams showing results of a test performed to specify a factor that causes sulfation deterioration. FIG. 7A is a diagram showing an increase in the lead sulfate amount (mass %) in a case where the battery was left in three different temperature environments, and FIG. 7B is a diagram showing an increase in the lead sulfate amount (mass %) in a case where the battery was left in three different SOCs.

As shown in FIGS. 7A and 7B, the lead sulfate amount gradually increased after the battery was left. Further, the lead sulfate amount has the characteristics that the increase rate of the lead sulfate amount increases as the temperature of the battery 3 increases and increases as the SOC decreases. That is, the progress rate of sulfation deterioration increases as the temperature of the battery 3 increases and the SOC decreases. Therefore, by using data related to the temperature and the SOC of the battery 3 acquired by the battery sensor unit 6, the ECU 7 calculates the value of the dimensionless sulfation deterioration degree, which is thought to be in a substantially proportional relationship with the lead sulfate amount of the battery 3, and further determines, based on the value of the sulfation deterioration degree, the deterioration of the battery 3 resulting from sulfation deterioration.

Figure 8:
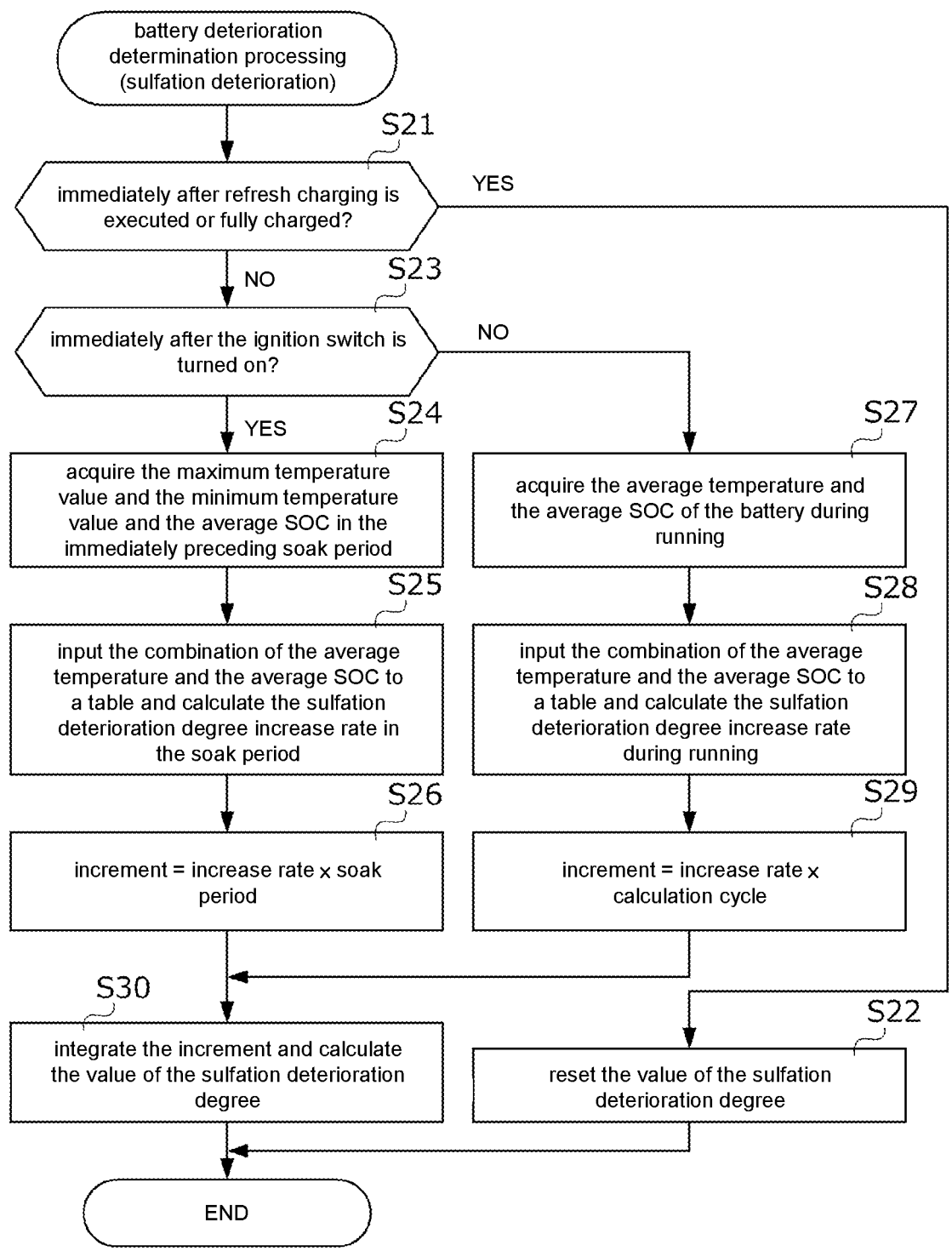
FIG. 8 is a flowchart showing a specific procedure for determining deterioration of a battery resulting from sulfation deterioration.

FIG. 8 is a flowchart showing a specific procedure for determining deterioration of the battery 3 resulting from sulfation deterioration. More specifically, FIG. 8 is a flowchart showing a specific procedure for calculating the value of the sulfation deterioration degree by the ECU 7. The flowchart of FIG. 8 is executed in the ECU 7 in each predetermined calculation cycle (for example, one hour) until the ignition switch 9 is turned off after the ignition switch 9 is turned on.

In S21, the ECU 7 determines whether it is immediately after refresh charging (which will be described later) is executed or the SOC of the battery 3 acquired from the battery sensor unit 6 is 100% (that is, the battery 3 is fully charged). If the determination in S21 is YES, the ECU 7 proceeds to S22, resets the value of the sulfation deterioration degree to 0 (which is the initial value), and terminates the processing of FIG. 8. If the determination in S21 is NO, the ECU 7 proceeds to S23.

In S23, the ECU 7 determines whether it is immediately after the start of the engine 1, that is, whether it is immediately after the ignition switch 9 is turned on. When the determination result of S23 is YES, the ECU 7 proceeds to S24, and if determination result is NO, it proceeds to S27.

In S24 to S26, the ECU 7 estimates the increment of the sulfation deterioration degree in the immediately preceding soak period from when the ignition switch 9 is turned off the previous time until the ignition switch 9 is turned on this time. More specifically, the ECU 7 acquires from the battery sensor unit 6 the maximum temperature value and the minimum temperature value and the average SOC of the battery 3 in the soak period (S24). In S25, the ECU 7 calculates the average temperature of the battery 3 in the immediately preceding soak period by using the maximum temperature value and the minimum temperature value (for example, average temperature=(maximum temperature value+minimum temperature value)/2). Further, by inputting the combination of the calculated average temperature and the average SOC to an association means, which associates the combination of the temperature and the SOC of the battery 3 with the sulfation deterioration degree increase rate corresponding to the increment of the sulfation deterioration degree per unit time, the ECU 7 calculates the sulfation deterioration degree increase rate.

Here, specifically, a table, a map, an arithmetic expression, a neural network, or the like defining the correlation between the combination of the temperature and the SOC of the battery 3 and the sulfation deterioration degree increase rate when the battery 3 is used with this combination of temperature and SOC is used as the association means.

FIG. 9 is a diagram showing an example of a sulfation deterioration degree increase rate calculation table. As shown in FIG. 9, the sulfation deterioration degree increase rate calculation table specifies the correlation between the combination of the temperature and the SOC of the battery 3 and the sulfation deterioration degree increase rate when the battery 3 is used with this combination of temperature and SOC. Such a sulfation deterioration degree increase rate calculation table is created by performing a test in advance on a battery of the same kind as the battery 3 used in the power supply system S and is stored in the storage medium of the ECU 7. As described with reference to FIGS. 7A and 7B, sulfation deterioration progresses faster as the temperature of the battery 3 increases and progresses faster as the SOC of the battery 3 decreases. Therefore, the sulfation deterioration degree increase rate is set to a larger value as the temperature of the battery 3 increases and is set to a larger value as the SOC of the battery 3 decreases. That is, in the example shown in FIG. 9, b11<b12< . . . <b16, b21<b22< . . . <b26, . . . , b71<b72< . . . <b76, and b11<b21 < . . . <b71, b12<b22< . . . <b72, . . . , b16<b26< . . . <b76.

Returning to FIG. 8, in S26, the ECU 7 multiplies the value of the sulfation deterioration degree increase rate, which is calculated by using the sulfation deterioration degree increase rate calculation table or the like in S25, by the immediately preceding soak period to calculate the increment of the sulfation deterioration degree in the immediately preceding soak period, and proceeds to S30.

In S27, the ECU 7 acquires from the battery sensor unit 6 the average temperature and the average SOC of the battery 3 during running in the period from the previous calculation cycle to the current calculation cycle.

In S28, the ECU 7 inputs the combination of the average temperature and the average SOC acquired in S27 to the association means such as the sulfation deterioration degree increase rate calculation table shown in FIG. 9 and calculates the value of the sulfation deterioration degree increase rate during running.

In S29, the ECU 7 calculates the increment of the sulfation deterioration degree in this calculation cycle by multiplying the value of the sulfation deterioration degree increase rate, which is calculated by using the sulfation deterioration degree increase rate calculation table or the like in S28, by the calculation cycle.

In S30, the ECU 7 calculates the value of the sulfation deterioration degree by integrating the increment calculated in S26 or S29. The ECU 7 calculates the value of the sulfation deterioration degree, which quantitatively represents the degree of progress of sulfation deterioration of the battery 3 with a positive value of 0 or more, by the above procedure and determines the deterioration of the battery 3 by using this value. More specifically, the ECU 7 determines the deterioration of the battery 3 by comparing the calculated value of the sulfation deterioration degree with a predetermined threshold value.

<Action of Deterioration Suppression of Sulfation Deterioration>

Next, a specific procedure for action of deterioration suppression for suppressing deterioration of the battery 3 resulting from sulfation deterioration as described above will be described.

Figure 10:
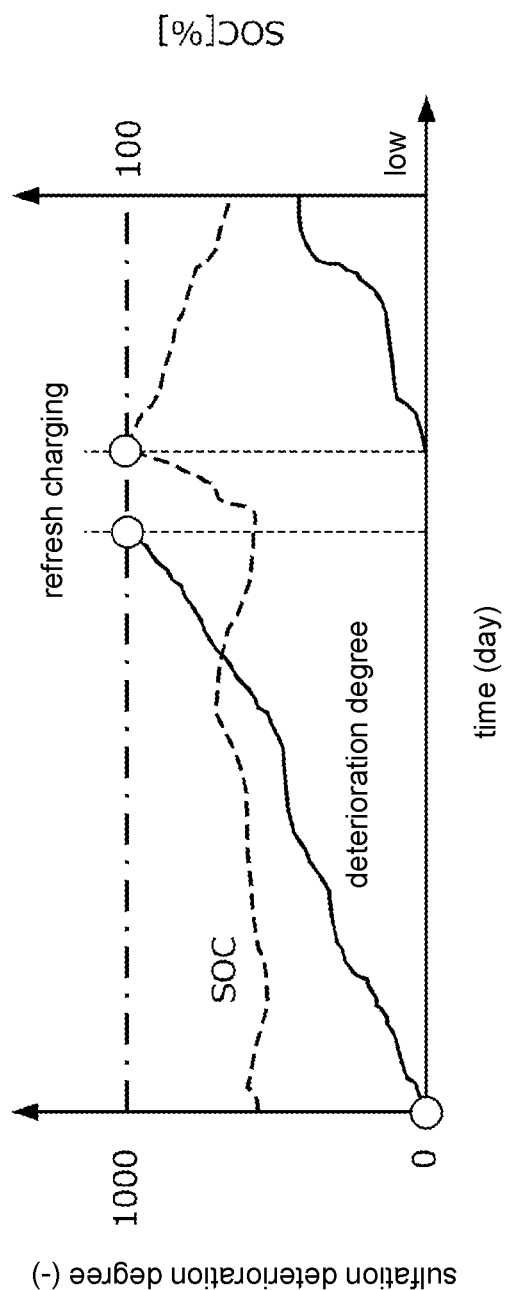
FIG. 10 is a diagram for explaining a specific procedure for action of deterioration suppression for suppressing deterioration resulting from sulfation deterioration.

FIG. 10 is a diagram for explaining a specific procedure of action of deterioration suppression using the sulfation deterioration degree. In FIG. 10, the horizontal axis is the time (day) elapsed since the time of manufacture of the battery 3 and the vertical axis is the sulfation deterioration degree (thick solid line) and the battery SOC (thick broken line).

As described above, lead sulfate adheres to the surface of the electrode of the battery 3 and further hardens and causes sulfation deterioration, but the lead sulfate can be dissolved into the electrolyte by charging before it crystallizes. Therefore, when the value of the sulfation deterioration degree calculated according to the procedure described with reference to FIG. 8 exceeds a predetermined threshold value (for example, 1000), the ECU 7 determines that adhesion of lead sulfate has progressed to some extent and executes refresh charging for controlling the power generation voltage of the ACG 21 so that the battery 3 is fully charged (that is, the SOC becomes 100%) (action of deterioration suppression against sulfation deterioration). By executing such refresh charging and forcibly charging the battery 3, it is possible to positively dissolve the lead sulfate adhering to the electrode into the electrolyte before it crystallizes. As a result, crystallization of the lead sulfate is delayed, and the lifetime of the battery 3 can be prolonged.

In addition, as described above, it is also possible to acquire the SOH of the battery 3 by the battery sensor unit 6. Further, since the SOH of the battery 3 is considered to decrease as sulfation deterioration progresses, this SOH can also be used as a parameter showing the degree of progress of sulfation deterioration similarly to the above sulfation deterioration degree. Therefore, the ECU 7 uses the SOH acquired by using the battery sensor unit 6 to determine the deterioration of the battery 3.

Figure 11:
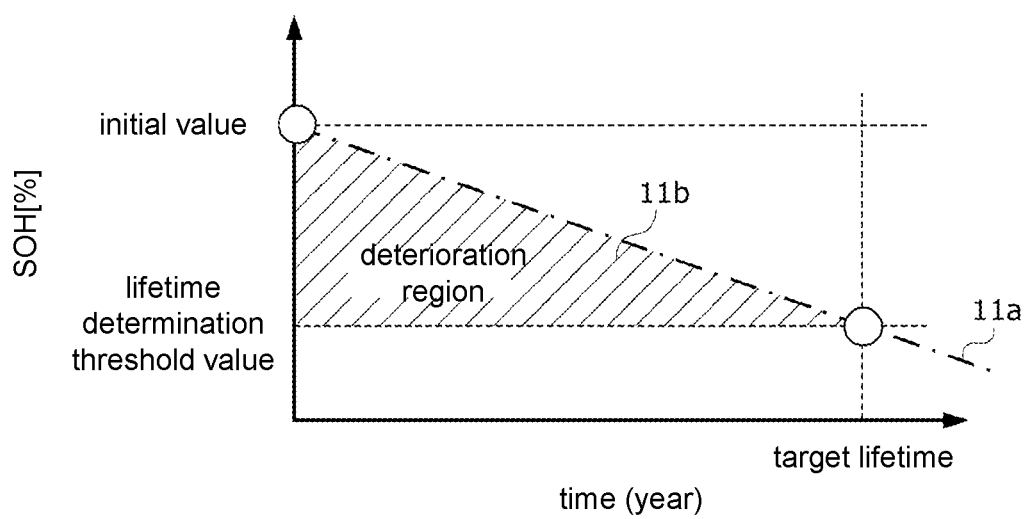
FIG. 11 is a diagram for explaining a specific procedure for action of deterioration suppression for suppressing deterioration resulting from sulfation deterioration.

FIG. 11 is a diagram for explaining a specific procedure for action of deterioration suppression using the SOH. In FIG. 11, the horizontal axis is the time (year) elapsed since the time of manufacture of the battery 3 and the vertical axis is the SOH (%).

As shown by a dot-dash line 11a in FIG. 11, it can be said that, in order to prolong the lifetime of the battery 3 to the target lifetime, it is ideal that the SOH decreases from a predetermined initial value and reaches a lifetime determination threshold value representing the lifetime of the battery 3 when the target lifetime has elapsed. Therefore, when the SOH acquired by using the battery sensor unit 6 is smaller than a threshold value, which decreases according to the time elapsed since the time of manufacture of the battery 3 as shown by the dot-dash line 11a, that is, when the SOH belongs to a deterioration region 11b represented by hatching in FIG. 11, the ECU 7 determines that the progress of sulfation deterioration is faster than the rate determined to fulfill the target lifetime, and increases the target SOC of the battery 3 to be higher than that before the deterioration determination. As a result, since the SOC of the battery 3 is maintained higher than that before the deterioration determination, the increase rate of the sulfation deterioration degree can be delayed, and the lifetime of the battery 3 can be prolonged to the target lifetime. Also, by delaying the increase rate of the sulfation deterioration degree in this way, it is possible to reduce the frequency at which refresh charging as described above is executed.

<Deterioration Determination of Softening of Active Material>

Next, a specific procedure for determining the degree of progress of deterioration resulting from softening of active material will be described. First, factors that accelerate softening of active material will be examined.

Figure 12:
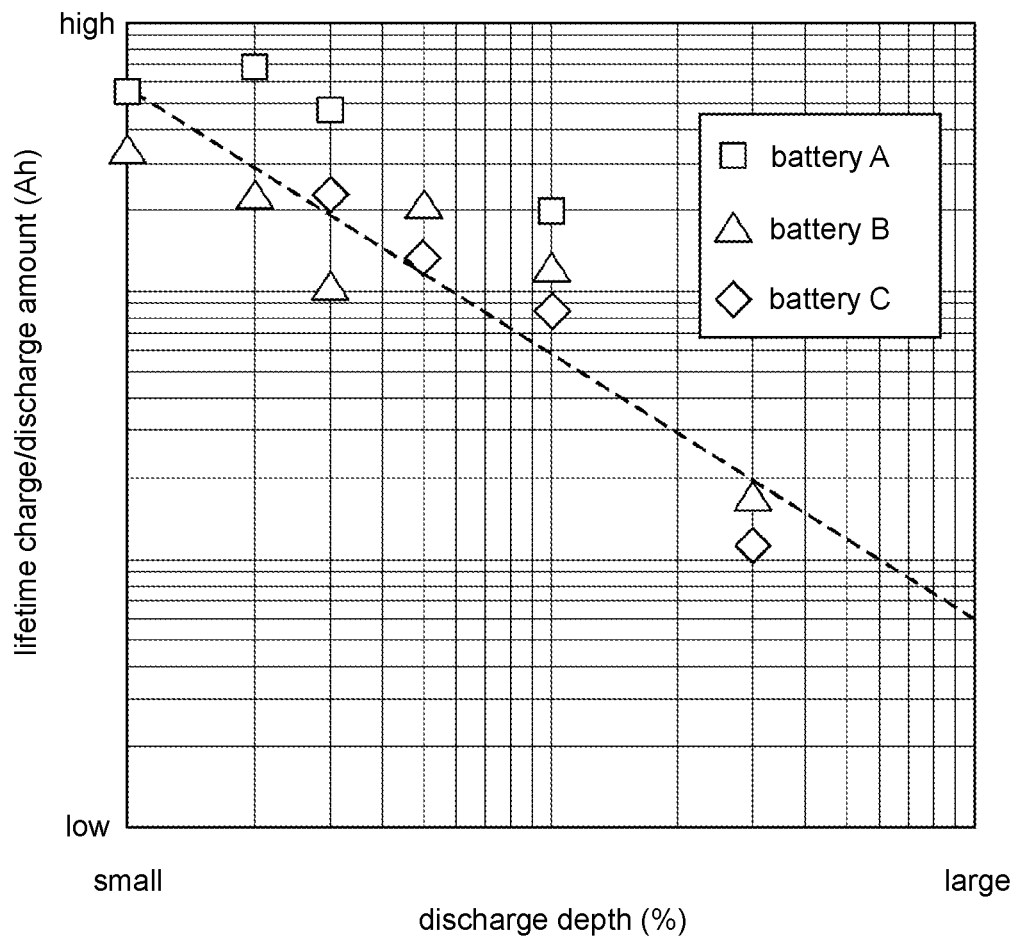
FIG. 12 is a diagram showing a result of a test performed to specify a factor that accelerates softening of a positive electrode active material.

FIG. 12 is a diagram showing a result of a test performed to specify a factor that accelerates softening of the positive electrode active material. In this test, batteries A, B, C, which were lead storage batteries with different specifications, were prepared. The lifetime charge/discharge amount (Ah) was measured by repeatedly executing charging/discharging under different discharge depths for the batteries A to C. The lifetime charge/discharge amount refers to the sum of charge amount (Ah) and discharge amount (Ah) until the battery lifetime runs out. Also, in this test, in the case of discharging from the battery for a predetermined time with a current of a predetermined value, it was determined that the lifetime of the battery had run out when the voltage drop of the battery was greater than or equal to a predetermined value.

In general, the lead storage battery has a finite lifetime charge/discharge amount because the positive electrode active material softens every time charging/discharging is repeated. Also, as shown in FIG. 12, although there was a difference depending on the type of battery, it is clear that the lifetime charge/discharge amount decreases as the discharge depth increases in all types of the batteries. In other words, it is clear that softening of the positive electrode active material progresses with increase of the charge/discharge amount, and accelerates as the discharge depth increases. This means that softening of the positive electrode active material can be evaluated quantitatively by using the charge amount, the discharge amount, and the discharge depth. Therefore, by using data related to the charge amount, the discharge amount, and the discharge depth of the battery 3 acquired by the battery sensor unit 6, the ECU 7 calculates the value of the effective charge/discharge amount (Ah), which is thought to be in a substantially proportional relationship with softening of the positive electrode active material, and further determines, based on the value of the effective charge/discharge amount, the deterioration of the battery 3 resulting from softening of the positive electrode active material.

Figure 13:
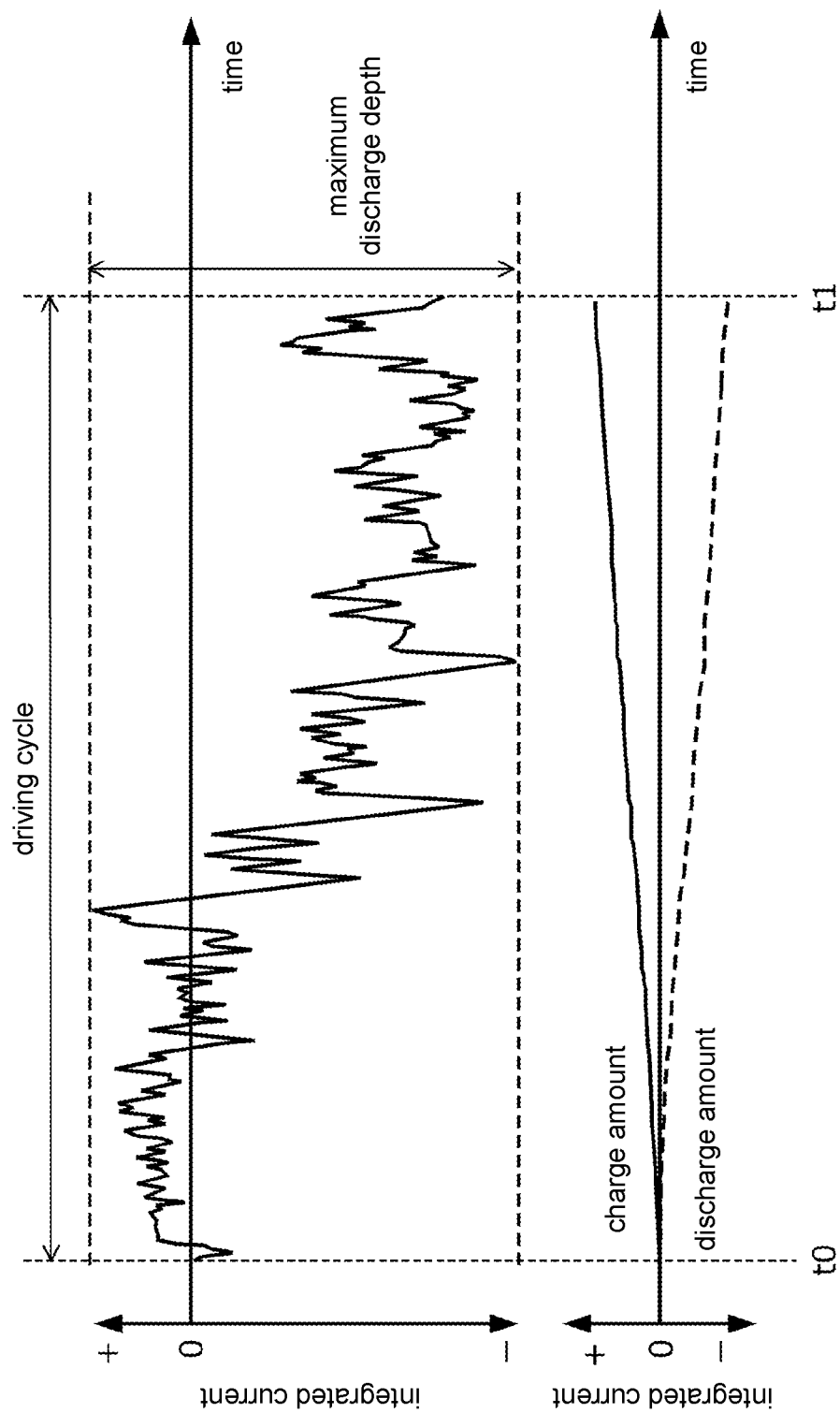
FIG. 13 is a diagram for explaining a procedure for calculating a value of an effective charge/discharge amount.

FIG. 13 is a diagram for explaining a procedure for calculating the value of the effective charge/discharge amount by the ECU 7. FIG. 13 is a diagram showing a change in an integrated current in a certain driving cycle (hereinafter abbreviated as "DC") from time t0 to time t1. The upper part of FIG. 13 shows the change in the integrated current calculated by assuming the charging current to be positive and the discharging current to be negative, and the lower part of FIG. 13 shows the charge amount (thick solid line) obtained by integrating only the positive charging current and the discharge amount (thick broken line) obtained by integrating only the negative discharging current. Each time one DC terminates, the ECU 7 calculates the increment of the effective charge/discharge amount defined below and calculates the value of the effective charge/discharge amount by integrating this increment.

The effective charge/discharge amount refers to an electric quantity obtained by correcting the electric quantity, which is obtained by combining the charge amount and the discharge amount, according to the discharge depth. As described above, the lifetime charge/discharge amount is finite, and this lifetime charge/discharge amount tends to decrease as the discharge depth increases. Therefore, the ECU 7 introduces the effective charge/discharge amount as described above in consideration of the influence of the discharge depth on the lifetime charge/discharge amount.

The ECU 7 acquires the value of the maximum discharge depth, which is the maximum value of the discharge depth measured in the current DC, the values of the charge amount and the discharge amount over the current DC, and the SOH from the battery sensor unit 6 each time one DC terminates and calculates the increment of the effective charge/discharge amount in the current DC according to the following equation (1).

increment (Ah) of effective charge/discharge amount=charge amount (Ah) over current DC+discharge amount (Ah) over current DC+maximum discharge depth (%) in current DC×SOH (%) in current DC×(deterioration acceleration coefficient−1)  (1)

As described above, softening of the positive electrode active material progresses each time the battery 3 charges/discharges. Therefore, as shown in the first and second terms on the right side of the above equation (1), the charge amount and the discharge amount are added as they are as the increment of the effective charge/discharge amount.

As described above, softening of the positive electrode active material has a characteristic that it accelerates as the discharge depth increases. The third term on the right side of the above equation (1) is introduced in consideration of such a characteristic and corresponds to a correction term for correcting the electric quantity, which is obtained by combining the charge amount and the discharge amount by using the maximum discharge depth. The deterioration acceleration coefficient in this correction term is one or more dimensionless positive coefficients for correcting the electric quantity to the increasing side according to the discharge depth, and the value is calculated by inputting the maximum discharge depth in the current DC to an association means that associates the maximum discharge depth with the deterioration acceleration coefficient.

Here, specifically, a table, a map, an arithmetic expression, a neural network, or the like defining the correlation between the maximum discharge depth in the current DC and the deterioration acceleration coefficient when the battery 3 is used at this maximum discharge depth is used as the association means.

Figure 14A:
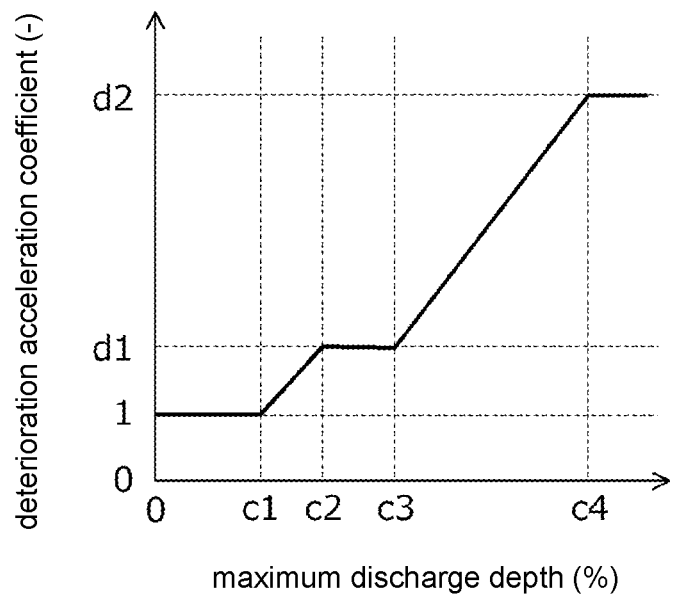
FIG. 14A is a diagram showing an example of a deterioration acceleration coefficient calculation map.
Figure 14B:
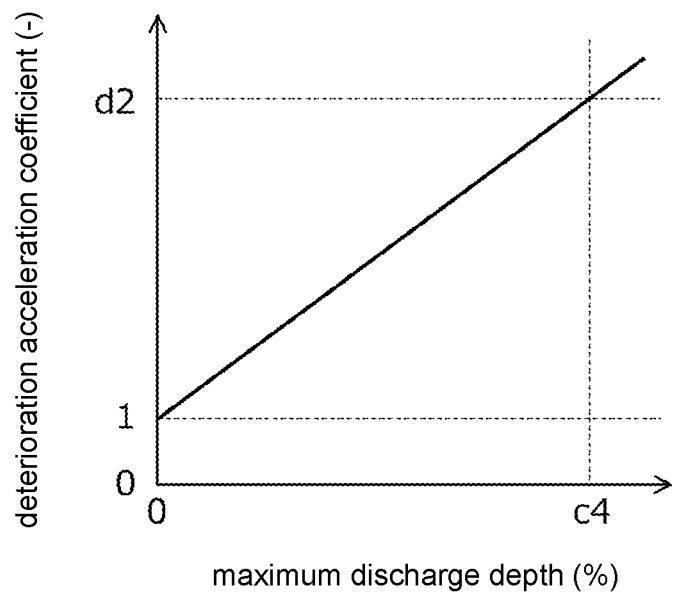
FIG. 14B is a diagram showing an example of a deterioration acceleration coefficient calculation map.
Figure 14C:
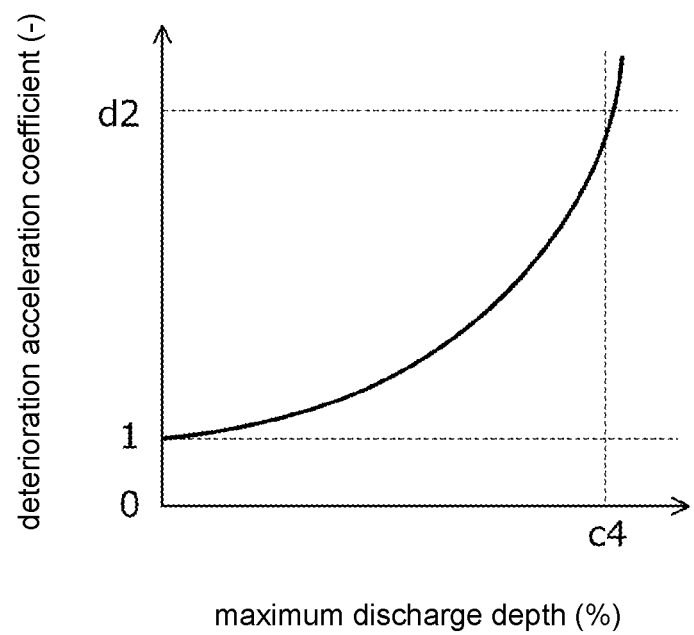
FIG. 14C is a diagram showing an example of a deterioration acceleration coefficient calculation map.

FIG. 14A is a diagram showing an example of a deterioration acceleration coefficient calculation map. As shown in FIG. 14A, the value of the deterioration acceleration coefficient is set to be a larger value as the maximum discharge depth increases. In the example shown in FIG. 14A, the value of the deterioration acceleration coefficient is set to 1 since no significant difference in the softening rate of the positive electrode active material was observed when the maximum discharge depth is between 0 and c1. In addition, when the maximum discharge depth is between c1 and c2, the value of the deterioration acceleration coefficient increases so that it becomes d1, which is larger than 1, at c2, and when the maximum discharge depth is between c2 and c3, the value of the deterioration acceleration coefficient is set to d1. In addition, when the maximum discharge depth is between c3 and c4, the value of the deterioration acceleration coefficient increases so that it becomes d2 at c4. When the maximum discharge depth is c4 or more, the value of the deterioration acceleration coefficient is set to d2. FIGS. 14B and 14C show other examples of the deterioration acceleration coefficient calculation map. The value of the deterioration acceleration coefficient may be calculated by using maps as shown in FIG. 14B and FIG. 14C.

The ECU 7 calculates the increment of the effective charge/discharge amount by using such a deterioration acceleration coefficient and thereby corrects the increment to the increasing side as the maximum discharge depth increases in the target DC. The ECU 7 calculates the increment of the effective charge/discharge amount for each DC according to the procedure as described above and integrates the increment to calculate the value of the effective charge/discharge amount. The effective charge/discharge amount calculated in this way corresponds to the lifetime charge/discharge amount taking into account the discharge depth for each DC and can be said to be a parameter indicating the degree of progress of softening of the positive electrode active material.

<Action of Deterioration Suppression of Softening of Positive Electrode Active Material>

Next, a specific procedure for action of deterioration suppression for suppressing deterioration of the battery 3 resulting from softening of positive electrode active material as described above will be described.

Figure 15:
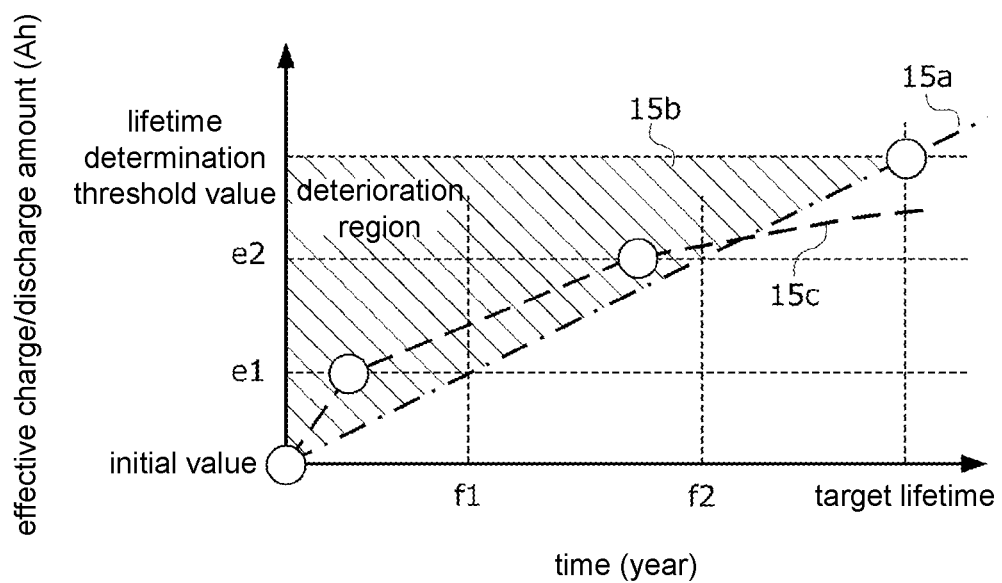
FIG. 15 is a diagram for explaining a specific procedure for action of deterioration suppression using the effective charge/discharge amount.

FIG. 15 is a diagram for explaining a specific procedure for action of deterioration suppression using the effective charge/discharge amount. In FIG. 15, the horizontal axis is the time (year) elapsed from the time of manufacture of the battery 3 and the vertical axis is the effective charge/discharge amount (Ah).

As described above, softening of the positive electrode active material has a characteristic that it accelerates as the discharge depth increases. Therefore, it is possible for the ECU 7 to execute three types of actions of deterioration suppression as the action of deterioration suppression for suppressing deterioration of the battery 3 resulting from softening of the positive electrode active material.

First, the automatic recovery conditions in idling stop control include "the discharge depth of the battery 3 obtained by the battery sensor unit 6 during the idling stop period exceeds a predetermined allowable discharge depth" (see automatic recovery condition (h) above). Therefore, when the value of the effective charge/discharge amount exceeds a predetermined threshold value, the ECU 7 determines that the deterioration resulting from softening of the positive electrode active material has progressed to some extent and sets the allowable discharge depth in the automatic recovery condition to a value smaller than that before the deterioration determination (first action of deterioration suppression against softening of the positive electrode active material). At the time of deterioration determination using the effective charge/discharge amount, by executing such a first action of deterioration suppression, the ECU 7 can reduce the discharge depth of the battery 3, thereby delaying the increase in the effective charge/discharge amount and thus prolonging the lifetime of the battery 3 to the target lifetime.

When the value of the effective charge/discharge amount exceeds the predetermined threshold value, the ECU 7 determines that the deterioration resulting from softening of the positive electrode active material has progressed to some extent and sets the target SOC of the battery 3 higher than that before the deterioration determination (second action of deterioration suppression against softening of the positive electrode active material). When the target SOC is set higher than that before the deterioration determination as described above, the SOC of the battery 3 after the deterioration determination is maintained higher than that before the deterioration determination. On the other hand, when an operation request of a specific electric load is made as described above, the battery 3 is forcibly charged, but by maintaining the SOC of the battery 3 high as described above, it is possible to reduce the discharge depth in the case where the operation request of the specific electric load is made. Therefore, at the time of deterioration determination using the effective charge/discharge amount, by executing the above second action of deterioration suppression, the ECU 7 can reduce the discharge depth of the battery 3, thereby delaying the increase in the effective charge/discharge amount and thus prolonging the lifetime of the battery 3 to the target lifetime.

Further, when the value of the effective charge/discharge amount exceeds the predetermined threshold value, the ECU 7 determines that the deterioration resulting from softening of the positive electrode active material has progressed to some extent and reduces the power generation voltage of the ACG 21 at the time of execution of fuel cut of the engine 1 to be lower than that before the deterioration determination (third action of deterioration suppression against softening of the positive electrode active material). At the time of deterioration determination using the effective charge/discharge amount, by executing the third action of deterioration suppression, the ECU 7 can make it difficult for the battery 3 to be charged at the time of fuel cut of the engine 1. Therefore, it is possible to reduce the discharge depth of the battery 3, thereby delaying the increase in the effective charge/discharge amount and thus prolonging the lifetime of the battery 3 to the target lifetime.

Here, a timing for executing the first to third actions of deterioration suppression for suppressing deterioration resulting from softening of the positive electrode active material as described above will be described. First, as shown by a dot-dash line 15a in FIG. 15, it can be said that, in order to prolong the lifetime of the battery 3 to the target lifetime, it is ideal that the value of the effective charge/discharge amount increases from a predetermined initial value and reaches a lifetime determination threshold value representing the lifetime of the battery 3 when the target lifetime has elapsed. Therefore, each time the value of the effective charge/discharge amount exceeds a plurality of deterioration determination threshold values (in FIG. 15, two threshold values e1 and e2 are shown) defined between the initial value and the lifetime determination threshold value, the ECU 7 determines whether time f1 and time f2 determined for each of the deterioration determination threshold values e1 and e2 have not elapsed. In other words, each time the value of the effective charge/discharge amount exceeds the deterioration determination threshold values e1 and e2, the ECU 7 determines whether it belongs to a deterioration region 15b indicated by hatching in FIG. 15. Then, if the ECU 7 determines that it belongs to the deterioration region 15b, the ECU 7 determines that softening of the positive electrode active material is progressing faster than the rate determined to fulfill the target lifetime, and by appropriately combining and executing any one or all of the first to third actions of deterioration suppression, the ECU 7 reduces the increase rate of the subsequent effective charge/discharge amount. As a result, the lifetime of battery 3 can be prolonged to the target lifetime. A line 15c of FIG. 15 illustrates the case where the first to third actions of deterioration suppression were executed since the time f1 has not elapsed when the value of the effective charge/discharge amount exceeded the deterioration determination threshold value e1, and then the first to third actions of deterioration suppression were executed since the time f2 has not elapsed when the value of the effective charge/discharge amount exceeded the deterioration determination threshold value e2. According to this example, by executing these actions of deterioration suppression at appropriate timings by using the effective charge/discharge amount, when the target lifetime has elapsed, the effective charge/discharge amount does not exceed the lifetime determination threshold value, and the target lifetime can be fulfilled.

As described above, in the power supply system S of this embodiment, the corrosion amount is introduced as a parameter quantitatively indicating the degree of deterioration resulting from positive electrode lattice corrosion of the battery 3. The sulfation deterioration degree of the battery 3 is introduced as a parameter quantitatively indicating the degree of deterioration resulting from sulfation deterioration of the battery 3. Further, the effective charge/discharge amount is introduced as a parameter quantitatively indicating the degree of deterioration resulting from softening of the positive electrode active material of the battery 3. The actions of deterioration suppression determined for each of the deterioration factors according to these parameters are appropriately executed, so as to prolong the lifetime of the battery 3.

Although the embodiments of the disclosure have been described above, the disclosure is not limited thereto. Within the scope of the disclosure, the details of configuration may be changed as appropriate.

What is claimed is:

1. A power supply system comprising:
a lead battery supplying power to an electric load of a vehicle;
a battery state acquisition device acquiring a value related to a state of the lead battery; and
a battery deterioration determination device determining the state of the lead battery based on the value acquired by the battery state acquisition device,
wherein the battery state acquisition device acquires a value of a charge amount of the lead battery, a value of a discharge amount of the lead battery, and a value of a discharge depth of the lead battery, and
the battery deterioration determination device determines deterioration of the lead battery based on a charge amount acquisition value, a discharge amount acquisition value, and a discharge depth acquisition value acquired by the battery state acquisition device,
wherein the battery deterioration determination device calculates an increment of a deterioration parameter indicating a degree of progress of deterioration of the lead battery by correcting a sum of the charge amount acquisition value and the discharge amount acquisition value over a predetermined period based on a maximum discharge depth acquisition value, which is a maximum value of a discharge depth acquired in the predetermined period, and the battery deterioration determination device calculates a value of the deterioration parameter by integrating the increment and determines deterioration of the lead battery based on the value of the deterioration parameter.

2. The power supply system according to claim 1, wherein the battery deterioration determination device increases the increment as the maximum discharge depth acquisition value increases.

3. A vehicle comprising:
the power supply system according to claim 2;
an internal combustion engine; and
an idling stop control device temporarily stopping the internal combustion engine in response to satisfaction of a stop condition and then restarting the internal combustion engine in response to satisfaction of a recovery condition,
wherein the recovery condition comprises that a discharge depth of the lead battery acquired during a period of temporarily stopping the internal combustion engine exceeds an allowable discharge depth, and
when the battery deterioration determination device determines that the lead battery has deteriorated, the idling stop control device sets the allowable discharge depth to a value smaller than a value before the determination that the lead battery has deteriorated.

4. A vehicle comprising:
the power supply system according to claim 2;
an internal combustion engine;
a power generator connected in parallel to the lead battery with respect to the electric load and generating power by using power of the internal combustion engine; and
a power generator control device controlling a power generation voltage of the power generator so that a charging rate of the lead battery is a target charging rate,
wherein when the battery deterioration determination device determines that the lead battery has deteriorated, the power generator control device increases the target charging rate to be higher than a rate before the determination that the lead battery has deteriorated.

5. A vehicle comprising:
the power supply system according to claim 2;
an internal combustion engine;
a power generator connected to the lead battery; and
a power generator control device controlling a power generation voltage of the power generator during fuel cut due to deceleration of the internal combustion engine,
wherein when the battery deterioration determination device determines that the lead battery has deteriorated, the power generator control device reduces the power generation voltage to be lower than a value before the determination that the lead battery has deteriorated.

6. The power supply system according to claim 1, wherein the deterioration parameter is a parameter indicating a degree of progress of deterioration resulting from softening of an active material of the lead battery.

7. The power supply system according to claim 2, wherein the deterioration parameter is a parameter indicating a degree of progress of deterioration resulting from softening of an active material of the lead battery.

8. A vehicle comprising:
the power supply system according to claim 6;
an internal combustion engine; and
an idling stop control device temporarily stopping the internal combustion engine in response to satisfaction of a stop condition and then restarting the internal combustion engine in response to satisfaction of a recovery condition,
wherein the recovery condition comprises that a discharge depth of the lead battery acquired during a period of temporarily stopping the internal combustion engine exceeds an allowable discharge depth, and
when the battery deterioration determination device determines that the lead battery has deteriorated, the idling stop control device sets the allowable discharge depth to a value smaller than a value before the determination that the lead battery has deteriorated.

9. A vehicle comprising:
the power supply system according to claim 6;
an internal combustion engine;
a power generator connected in parallel to the lead battery with respect to the electric load and generating power by using power of the internal combustion engine; and
a power generator control device controlling a power generation voltage of the power generator so that a charging rate of the lead battery is a target charging rate,
wherein when the battery deterioration determination device determines that the lead battery has deteriorated, the power generator control device increases the target charging rate to be higher than a rate before the determination that the lead battery has deteriorated.

10. A vehicle comprising:
the power supply system according to claim 6;
an internal combustion engine;
a power generator connected to the lead battery; and
a power generator control device controlling a power generation voltage of the power generator during fuel cut due to deceleration of the internal combustion engine,
wherein when the battery deterioration determination device determines that the lead battery has deteriorated, the power generator control device reduces the power generation voltage to be lower than a value before the determination that the lead battery has deteriorated.

11. A vehicle comprising:
the power supply system according to claim 7;
an internal combustion engine; and
an idling stop control device temporarily stopping the internal combustion engine in response to satisfaction of a stop condition and then restarting the internal combustion engine in response to satisfaction of a recovery condition,
wherein the recovery condition comprises that a discharge depth of the lead battery acquired during a period of temporarily stopping the internal combustion engine exceeds an allowable discharge depth, and
when the battery deterioration determination device determines that the lead battery has deteriorated, the idling stop control device sets the allowable discharge depth to a value smaller than a value before the determination that the lead battery has deteriorated.

12. A vehicle comprising:
the power supply system according to claim 7;
an internal combustion engine;
a power generator connected in parallel to the lead battery with respect to the electric load and generating power by using power of the internal combustion engine; and
a power generator control device controlling a power generation voltage of the power generator so that a charging rate of the lead battery is a target charging rate,
wherein when the battery deterioration determination device determines that the lead battery has deteriorated, the power generator control device increases the target charging rate to be higher than a rate before the determination that the lead battery has deteriorated.

13. A vehicle comprising:
the power supply system according to claim 7;
an internal combustion engine;
a power generator connected to the lead battery; and
a power generator control device controlling a power generation voltage of the power generator during fuel cut due to deceleration of the internal combustion engine,
wherein when the battery deterioration determination device determines that the lead battery has deteriorated, the power generator control device reduces the power generation voltage to be lower than a value before the determination that the lead battery has deteriorated.

14. A vehicle comprising:
the power supply system according to claim 1;
an internal combustion engine; and
an idling stop control device temporarily stopping the internal combustion engine in response to satisfaction of a stop condition and then restarting the internal combustion engine in response to satisfaction of a recovery condition,
wherein the recovery condition comprises that a discharge depth of the lead battery acquired during a period of temporarily stopping the internal combustion engine exceeds an allowable discharge depth, and
when the battery deterioration determination device determines that the lead battery has deteriorated, the idling stop control device sets the allowable discharge depth to a value smaller than a value before the determination that the lead battery has deteriorated.

15. A vehicle comprising:
the power supply system according to claim 1;
an internal combustion engine;
a power generator connected in parallel to the lead battery with respect to the electric load and generating power by using power of the internal combustion engine; and a power generator control device controlling a power generation voltage of the power generator so that a charging rate of the lead battery is a target charging rate, wherein when the battery deterioration determination device determines that the lead battery has deteriorated, the power generator control device increases the target charging rate to be higher than a rate before the determination that the lead battery has deteriorated.

16. A vehicle comprising:

the power supply system according to claim 1;

an internal combustion engine;

a power generator connected to the lead battery; and a power generator control device controlling a power generation voltage of the power generator during fuel cut due to deceleration of the internal combustion engine, wherein when the battery deterioration determination device determines that the lead battery has deteriorated, the power generator control device reduces the power generation voltage to be lower than a value before the determination that the lead battery has deteriorated.

\* \* \* \* \*